(12) United States Patent
Shinohara et al.

(10) Patent No.: US 9,638,719 B2
(45) Date of Patent: May 2, 2017

(54) PROBE DEVICE HAVING CLEANING MECHANISM FOR CLEANING CONNECTION CONDUCTOR

(71) Applicant: Tokyo Electron Limited, Tokyo (JP)

(72) Inventors: Eiichi Shinohara, Yamanashi (JP); Munetoshi Nagasaka, Yamanashi (JP); Yoshiyasu Kato, Yamanashl (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 3 days.

(21) Appl. No.: 14/781,003

(22) PCT Filed: Mar. 18, 2014

(86) PCT No.: PCT/JP2014/058151
§ 371 (c)(1),
(2) Date: Sep. 28, 2015

(87) PCT Pub. No.: WO2014/157122
PCT Pub. Date: Oct. 2, 2014

(65) Prior Publication Data
US 2016/0054357 A1    Feb. 25, 2016

(30) Foreign Application Priority Data

Mar. 28, 2013  (JP) ................................. 2013-067810

(51) Int. Cl.
*G01R 3/00* (2006.01)
*G01R 31/28* (2006.01)
*G01R 1/073* (2006.01)

(52) U.S. Cl.
CPC ........... *G01R 3/00* (2013.01); *G01R 1/07342* (2013.01); *G01R 31/2886* (2013.01); *G01R 31/2887* (2013.01); *G01R 31/2889* (2013.01)

(58) Field of Classification Search
CPC ....................................................... G01R 3/00
(Continued)

(56) References Cited

U.S. PATENT DOCUMENTS 4,918,374 A * 4/1990 Stewart
5,060,371 A * 10/1991 Stewart
(Continued)

FOREIGN PATENT DOCUMENTS

JP    H11-054574 A    2/1999
JP    2000338152 A  * 12/2000
(Continued)

OTHER PUBLICATIONS

The International Search Report.

*Primary Examiner* — Walter L Lindsay, Jr.
*Assistant Examiner* — Milton Gonzalez

(57) ABSTRACT

A probe device includes an electrode plate arranged above a mounting table for mounting thereon a semiconductor wafer and electrically connected to a tester, a connection conductor arranged at a side of the mounting table and electrically connected to a mounting table electrode formed on a mounting surface of the mounting table, and a cleaning mechanism including a polishing unit for polishing a contact portion of the connection conductor, a brush cleaning unit for performing a brush-cleaning of the contact portion, and a contact resistance measuring unit for measuring a contact resistance of the contact portion. The mounting table electrode is in contact with a backside electrode of a semiconductor device of the semiconductor wafer. When the connection conductor is connected to the electrode plate, a backside electrode formed on a backside of the semiconductor device and the tester are electrically connected to each other.

4 Claims, 6 Drawing Sheets

(58) Field of Classification Search
USPC .................................... 324/758.01, 758.04
See application file for complete search history.

(56) References Cited

U.S. PATENT DOCUMENTS

| | | | |
|---|---|---|---|
| 5,778,485 A * | 7/1998 | Sano | |
| 6,765,401 B2 * | 7/2004 | Hamada | |
| 6,817,052 B2 * | 11/2004 | Grube | |
| 6,927,078 B2 * | 8/2005 | Saijyo | ............... G01R 3/00 |
| 7,250,779 B2 * | 7/2007 | Dunklee | |
| 2013/0063171 A1 | 3/2013 | Kouno et al. | |

FOREIGN PATENT DOCUMENTS

| | | |
|---|---|---|
| JP | 2012/058225 A | 3/2012 |
| KR | 10-2012-0128159 A | 11/2012 |

* cited by examiner

PROBE DEVICE HAVING CLEANING MECHANISM FOR CLEANING CONNECTION CONDUCTOR

CROSS REFERENCE

This application is a National Stage Application of, and claims priority to, PCT Application No. PCT/JP2014/058151, filed on Mar. 18, 2014, entitled "Probe Device," which claims priority to Japanese Patent Application No. 2013-067810, filed on Mar. 28, 2013. The foregoing patent applications are herein incorporated by reference by entirety for all purposes.

FIELD OF THE INVENTION

The present invention relates to a probe device.

BACKGROUND OF THE INVENTION

In a manufacturing process of a semiconductor device, a probe device is used to perform an electrical test of a semiconductor device formed on a semiconductor wafer. In the probe device, a semiconductor wafer is mounted on a mounting table (chuck top) and electrical conduction is obtained by driving the mounting table to bring probes into contact with electrodes of the semiconductor device of the semiconductor wafer. The test of the semiconductor device is performed by applying a predetermined test signal from a measuring device (tester) to the semiconductor device through the probe and detecting an output signal from the semiconductor device.

In a probe device for performing an electrical test of a semiconductor device having an electrode at the backside of the semiconductor wafer, e.g., a power device having a collector electrode formed at the backside of the semiconductor wafer, a conductive film electrode made of a conductive metal such as gold is formed as a mounting table electrode at a mounting surface of a mounting table (chuck top) and the conductive film electrode is made contact with the electrode formed at the backside of the semiconductor wafer, thereby obtaining electrical conduction. The power device has a high withstand voltage and a high current compared to a general semiconductor device and may have a high speed and a high frequency depending on purpose. An insulated-gate bipolar transistor (IGBT), a diode, a power transistor, a power MOSFET, a thyristor and the like may be used as the power device. The quality of the power device is determined by measuring its electrical characteristic (static characteristic and dynamic characteristic).

Further, in the probe device for performing an electrical test of the power device and the like, if the conductive film electrode and the tester are electrically connected to each other by a cable or the like, the cable becomes longer due to a driving type of the mounting table and this leads to an increase of resistance or inductance of the cable. For this reason, there has been known a probe device having a configuration that a metallic connection conductor electrically connected to the conductive film electrode is provided at a side surface of the mounting table and the connection conductor is made contact with a metallic electrode plate provided above the mounting table to obtain electrical conduction (see, e.g., Patent Document 1).

Patent Document 1: Japanese Patent Application Publication No. 2012-58225.

However, in the probe device having the above configuration, since electrical conduction is obtained by making the metallic connection conductor contact with the metallic electrode plate, metal pieces and the like are generated by the contact and a contact resistance between the connection conductor and the electrode plate gradually increases while the test is performed repeatedly. Accordingly, it may be difficult to perform a test having a high precision.

SUMMARY OF THE INVENTION

In view of the above, the present invention provides a probe device capable of performing a test with high precision for a long period of time.

In accordance with an aspect, there is provided a probe device which is electrically connected to a semiconductor device formed on a semiconductor wafer and performs an electrical test of the semiconductor device by a tester, the probe device including: a mounting table configured to mount thereon the semiconductor wafer; a mounting table electrode formed on a mounting surface of the mounting table on which the semiconductor wafer is mounted, the mounting table electrode being in contact with a backside electrode formed on a backside of the semiconductor device; a probe card arranged above the mounting table, the prove card having a plurality of probes electrically connected to the tester; a driving mechanism configured to drive the mounting table to make the probes contact with electrodes of the semiconductor device of the semiconductor wafer mounted on the mounting table; an electrode plate arranged above the mounting table and electrically connected to the tester; a connection conductor arranged at a side of the mounting table and electrically connected to the mounting table electrode, the connection conductor being connectable to the electrode plate, wherein when the connection conductor is connected to the electrode plate, the backside electrode and the tester are electrically connected to each other; and a cleaning mechanism including a polishing unit configured to polish a contact portion of the connection conductor with the electrode plate, a brush cleaning unit configured to perform a brush-cleaning of the contact portion, and a contact resistance measuring unit configured to measure a contact resistance of the contact portion.

Effect of the Invention

In accordance with the present invention, there is provided a probe device capable of performing a test with high precision for a long period of time.

DETAILED DESCRIPTION OF THE EMBODIMENTS

Hereinafter, embodiments of the present invention will be described with respect to the accompanying drawings.

Figure 1:
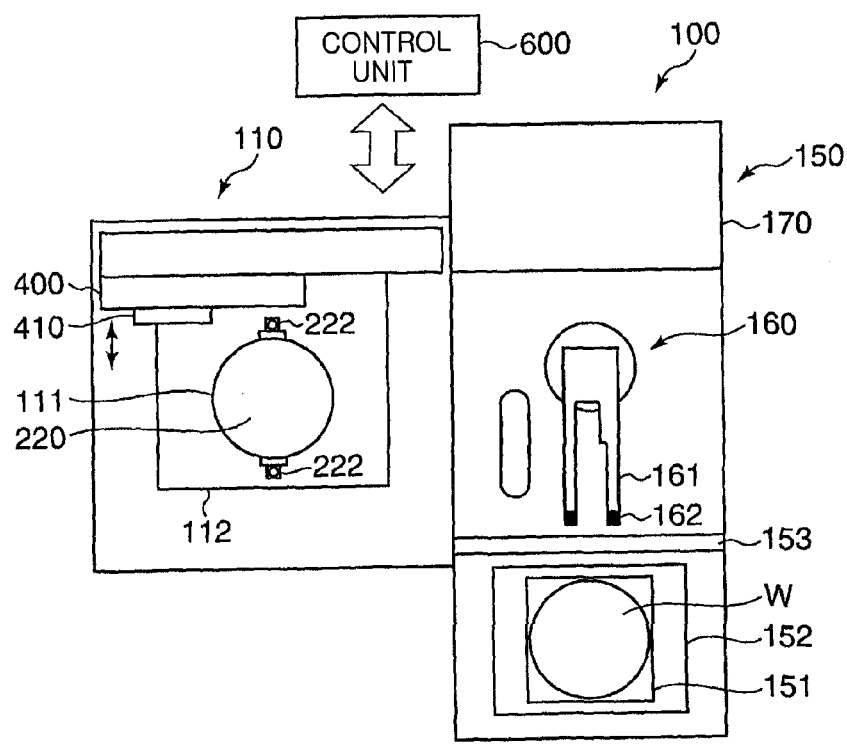
FIG. 1 is a plan view schematically showing an entire configuration of a probe device in accordance with an embodiment of the present invention.
Figure 2:
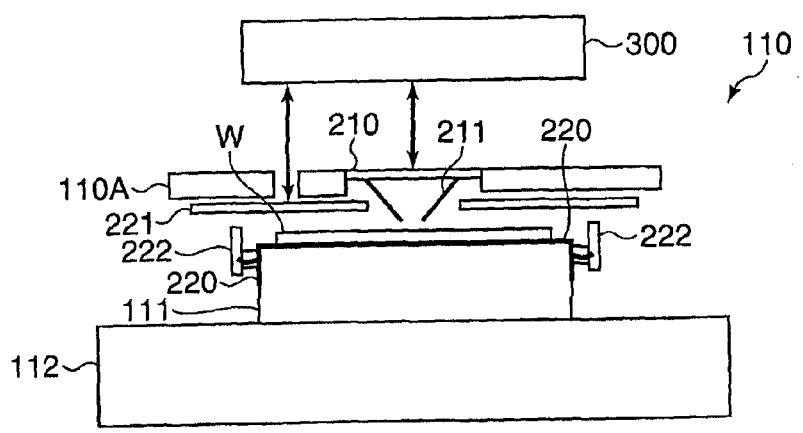
FIG. 2 is a side view schematically showing a configuration of a main part of the probe device shown in FIG. 1.

FIG. 1 is a plan view schematically showing an entire configuration of a probe device 100 in accordance with an embodiment of the present invention. FIG. 2 is a side view schematically showing a configuration of a main part of the probe device 100 of FIG. 1.

As shown in FIG. 1, the probe device 100 mainly includes a measuring unit 110, a loader unit 150 serving as a transfer unit, and a control unit 600. The entire operation of the probe device 100 is controlled by the control unit 600 having a computer and the like.

In the measuring unit 110, a mounting table 111 on which a semiconductor wafer W is mounted is provided to be movable in x-y-z-θ directions. Probes 211 (see FIG. 2) installed at a probe card 210 and electrodes of semiconductor devices formed on the semiconductor wafer W are made contact to each other by driving the mounting table 111 by using a driving mechanism 112, and electrical characteristics of the semiconductor devices are measured.

A bridge 400 on which an alignment camera (not shown) is mounted is installed above the mounting table 111. The bridge 400 can be driven, in parallel to a mounting surface of the mounting table 111, in forward and backward directions (up-down direction in FIG. 1) of the probe device 100. A cleaning unit 410 is installed at the bridge 400. The detail configuration of the cleaning unit 410 will be later described.

A load port 152 on which a wafer carrier (wafer cassette or FOUP) 151 accommodating the semiconductor wafer W is mounted is installed at the front side of the loader unit 150 (lower side in FIG. 1), and a wafer transfer mechanism 160 is installed adjacent to the load port 152. A position alignment mechanism 170 is installed at the rear side of the loader unit 150 (upper side in FIG. 1). The position alignment mechanism 170 detects a position of a notch of the semiconductor wafer W and an eccentric state of the semiconductor wafer W by rotating the semiconductor wafer W.

The wafer transfer mechanism 160 includes a wafer transfer arm 161 for vacuum-suctioning and transferring the semiconductor wafer W. The wafer transfer arm 161 includes a plurality of (two in this embodiment) suction portions (suction pad) 162 for vacuum-suctioning and holding the semiconductor wafer W. A vacuum line (not shown in FIG. 1) connected to a suction source such as a vacuum pump is connected to the suction portions 162. The wafer transfer arm 161 may be, if necessary, provided in plural number in a vertically overlapped state.

The wafer transfer mechanism 160 transfers the semiconductor wafer W between the wafer carrier 151 mounted on the load port 152, the position alignment mechanism 170, and the mounting table 111 of the measuring unit 110 by extending, retracting and rotating the wafer transfer arm 161.

The load port 152 is movable up and down by a vertical moving mechanism. A support frame 153 is provided between the load port 152 and the wafer transfer mechanism 160. An optical detector (not shown) is installed at the support frame 153. The optical detector detects presense or absence of the semiconductor wafer W while the wafer carrier 151 mounted on the load port 152 is moved up and down. Therefore, it is possible to detect a slot in the wafer carrier 151 which receives the semiconductor wafer W.

As shown in FIG. 2, the probe card 210 is disposed above the mounting table 111 and fixed to a head plate 110A arranged at an upper portion of the measuring unit 110 through a clamp mechanism (not shown). A plurality of probes 211 is installed at the probe card 210 and the probes 211 are electrically connected to a tester 300.

A conductive film electrode 220 (indicated by a bold line in FIG. 2), which is a mounting table electrode, made of conductive metal such as gold or the like is formed on the mounting surface of the mounting table 111 on which the semiconductor wafer W is mounted and on an upper portion of the side surface of the mounting table 111. The conductive film electrode 220 contacts with a backside electrode formed on the backside of the semiconductor device of the mounted semiconductor wafer W. A vacuum chuck (not shown) and a temperature control mechanism (not shown) are provided in the mounting table 111, so that the semiconductor wafer W mounted on the mounting table 111 can be sucked and held and can be controlled to a desired temperature.

An electrode plate 221 is provided between the probe card 210 and the mounting table 111. The electrode plate 221 is electrically connected to the tester 300. A plurality of (in this embodiment, total two at positions distanced by 180°) contact probes 222 serving as a connection conductor is provided at the side of the mounting table 111. The contact probes 222 are electrically connected to the conductive film electrode 220. When the mounting table 111 is elevated, the contact probes 222 and the electrode plate 221 are made contact with each other and thus the conductive film electrode 220 and the tester 300 are electrically connected to each other. The electrode plate 221 has a shape that is contactable with the contact probes 222 at any positions when the probes 211 are made contact with the electrodes of the top surface of the semiconductor wafer W by driving the mounting table 111. For example, the electrode plate 221 may have a shape divided by two to allow the annular or two contact probes 222 to contact with the electrode plate 221.

Figure 3:
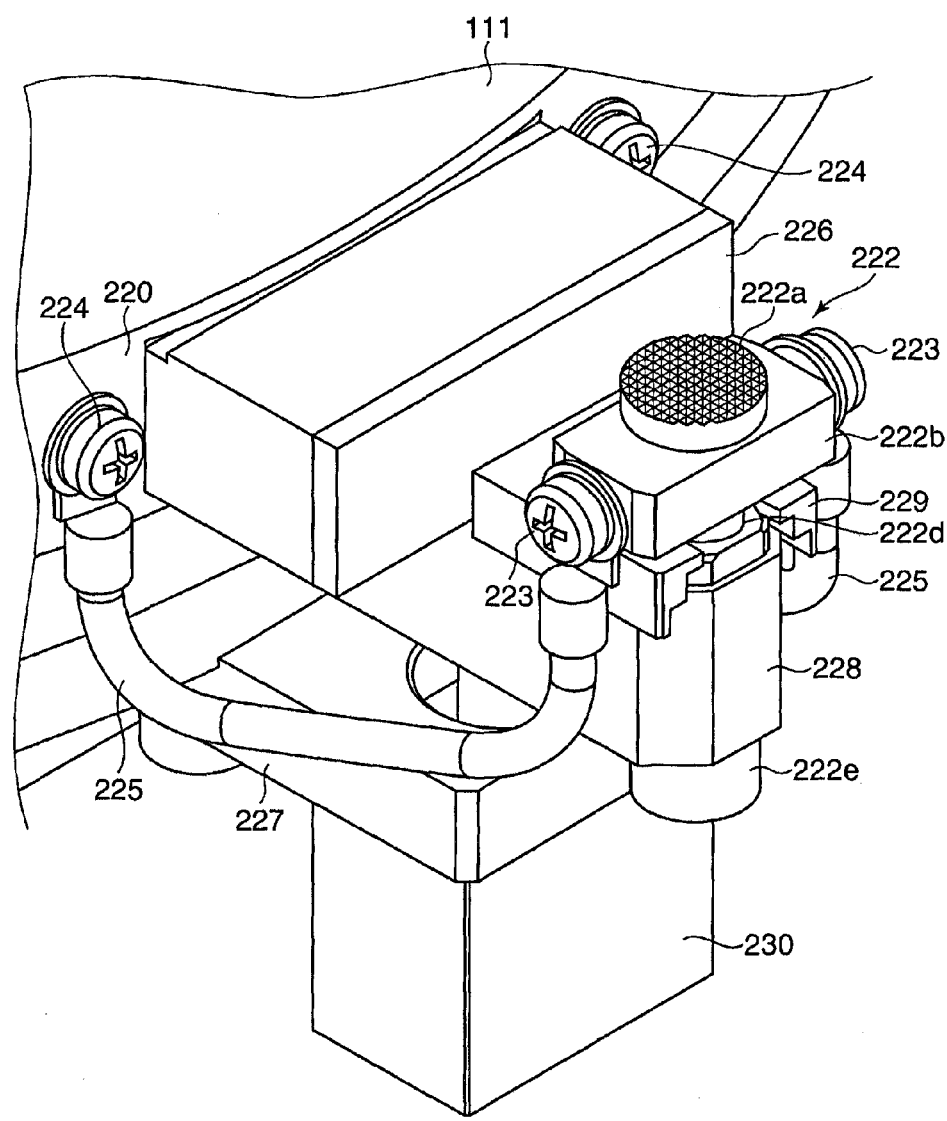
FIG. 3 is a perspective view schematically showing a configuration of a contact probe and its surroundings shown in FIG. 1.

As shown in FIG. 3, a disk-shaped contact portion 222a is provided at the apex of the contact probe 222. The top surface of the contact portion 222a is formed uneven. Below the contact portion 222a, a rectangular parallelepiped-shaped cable connection portion 222b is provided. The contact portion 222a and the cable connection portion 222b are formed integrally and made of metal such as brass or the like. That is, the contact portion 222a and the cable connection portion 222b are formed by cutting one metal material.

A gold-plated layer having a thickness of, e.g., about 0.3 μm to 0.5 μm is formed on the surface of the contact portion 222a and the cable connection portion 222b. An intermediate plated layer made of electroless nickel plating or the like having a thickness of, e.g., about 3 μm is formed under the gold-plated layer.

Figure 4:
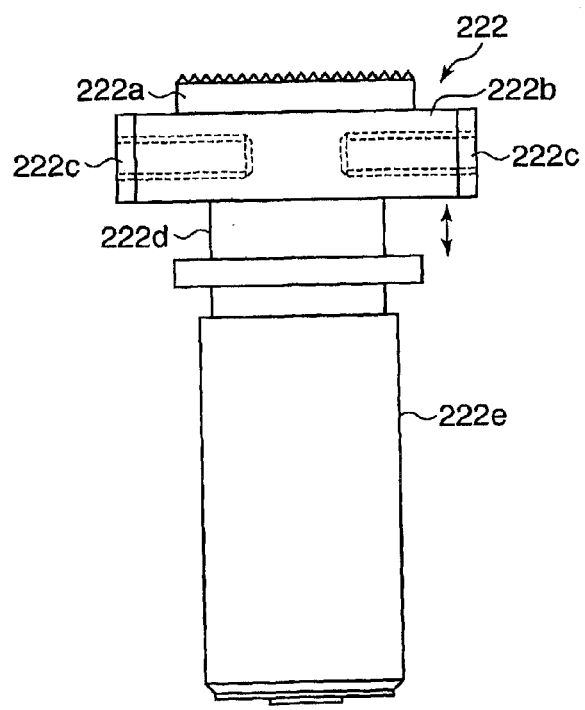
FIG. 4 is a side view schematically showing a configuration of the contact probe shown in FIG. 1.

As shown in FIG. 4, two screw holes 222c are formed so as to be positioned at opposite end portions in the lengthwise direction of the cable connection portion 222b at the side wall portions of the cable connection portion 222b. By screwing screws 223 (see FIG. 3) into the screw holes 222c and screws 224 into screw holes (not shown) formed at the conductive film electrode 220 of the mounting table 111, a conductor of a cable 225 is fixed by the screws 223 and 224 and thus the conductive film electrode 220 and the contact probe 222 are electrically connected to each other.

A cylindrical portion 222d is formed below the cable connection portion 222b. The cylindrical portion 222d is accommodated in a cylindrical member 222e. The contact portion 222a, the cable connection portion 222b and the like are biased toward the upper side with respect to the cylindrical member 222e by a biasing member (not shown) such as a coil spring provided in the cylindrical member 222e. As indicated by an arrow in FIG. 4, the contact portion 222a, the cable connection portion 222b and the like are movable in the vertical direction with respect to the cylindrical member 222e. Accordingly, the contact portion 222a contacts with the electrode plate 221 in an elastically pressed state.

As described above, in the probe device 100 of the present embodiment, the cable connection portion 222b is arranged just below the contact portion 222a of the contact probe 222. Further, the contact portion 222a and the cable connection portion 222b are integrally formed, and no sliding unit for making the contact portion 222a elastically contact with the electrode plate 221 is interposed between the contact portion 222a and the cable connection portion 222b. Furthermore, the gold-plated layer is formed on the surfaces of the contact portion 222a and the cable connection portion 222b.

Accordingly, an electrical path between the contact portion 222a and the cable connection portion 222b can be made shorter, thereby suppressing an increase in electric resistance and inductance. Further, the cable connection portion 222b and the conductive film electrode 220 are electrically connected to each other by the short cable 225 having low electric resistance, so that electric resistance between the conductive film electrode 220 and the tester 300 can be greatly reduced compared to a conventional case. Furthermore, since an electrical path from the conductive film electrode 220 to the contact portion 222a is short, inductance component can also be reduced.

As shown in FIG. 3, a stopper and guide block 226 made of aluminum or the like is fixed to the side wall of the mounting table 111. A base block 227 made of stainless steel or the like is provided protruding from a lower portion of the mounting table 111. The contact probe 222 is locked to the base block 227 through a probe guide block 228 made of, e.g., resin such as PEEK (polyether ether ketone) or the like and a probe presser 229 made of, e.g., aluminum or the like.

An elevation mechanism 230 for moving the contact probe 222 up and down is provided below the base block 227. The elevation mechanism 230 moves the contact probe 222 up and down between an elevated position and a lowered position when the probes 211 have contacted with the electrodes of the top surface of the semiconductor wafer W by the elevation of the mounting table 111. At the elevated position, the contact portion 222a contacts with the electrode plate 221 and at the lowered position, the contact portion 222a does not contact with the electrode plate 221.

The elevation mechanism 230 can change a position in the vertical direction of the contact probe 22 in multi-steps between the elevated position and the lowered position. By doing so, a contact state between the contact portion 222a and the electrode plate 221 can be adjusted to an optimal state.

Figure 5:
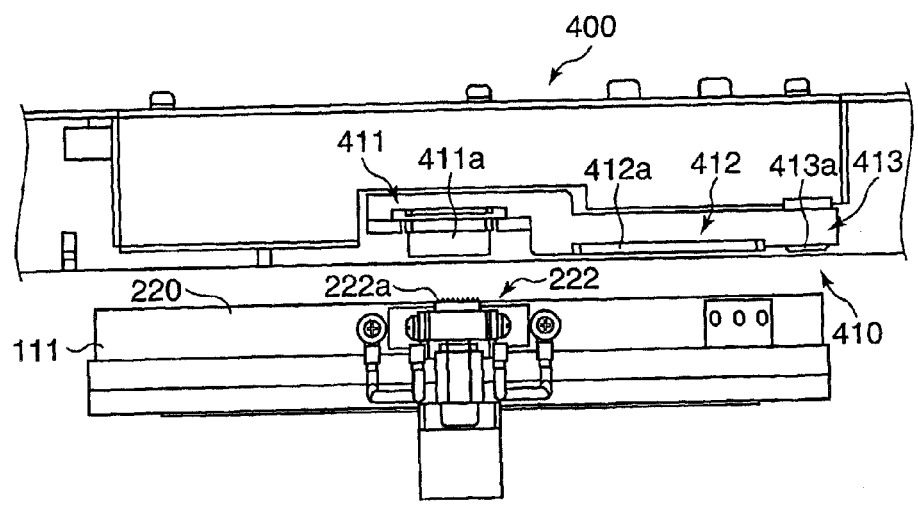
FIG. 5 is a side view schematically showing a configuration of the side of a cleaning unit shown in FIG. 1.
Figure 6:
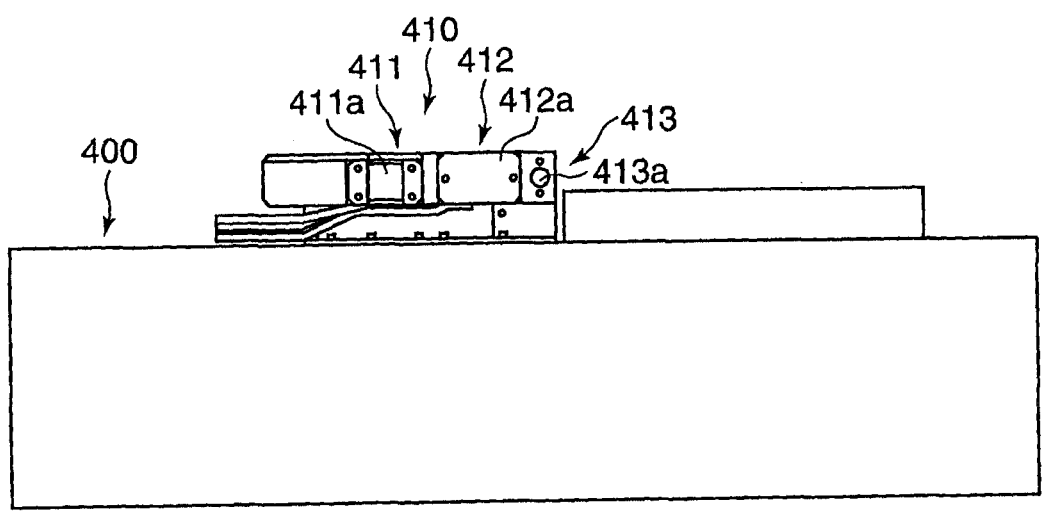
FIG. 6 is a bottom view schematically showing a configuration of the bottom of the cleaning unit shown in FIG. 1.

FIG. 5 is a view schematically showing a configuration of the side of the cleaning unit 410. FIG. 6 is a view schematically showing a configuration of the bottom of the cleaning unit 410. As shown in FIGS. 5 and 6, a brush unit 411, a polishing unit 412 and a contact resistance measuring unit 413 are provided in the cleaning unit 410. The brush unit 411 has a brush 411a, and performs brush-cleaning by making the brush 411a contact with the top surface of the contact portion 222a of the contact probe 222 and rubbing the top surface of the contact portion 222a with the brush 411a.

The polishing unit 412 has a polishing member 412a made of ceramic or the like. The polishing unit 412 polishes the top surface of the contact portion 222a of the contact probe 222 by making the polishing member 412a contact with the top surface of the contact portion 222a and rubbing the top surface of the contact portion 222a with the polishing member 412a. The contact resistance measuring unit 413 has a contact resistance measuring electrode 413a, and measures a contact resistance by using a measuring mechanism (not shown) while making the contact resistance measuring electrode 413a contact with the top surface of the contact portion 222a of the contact probe 222.

Figure 7:
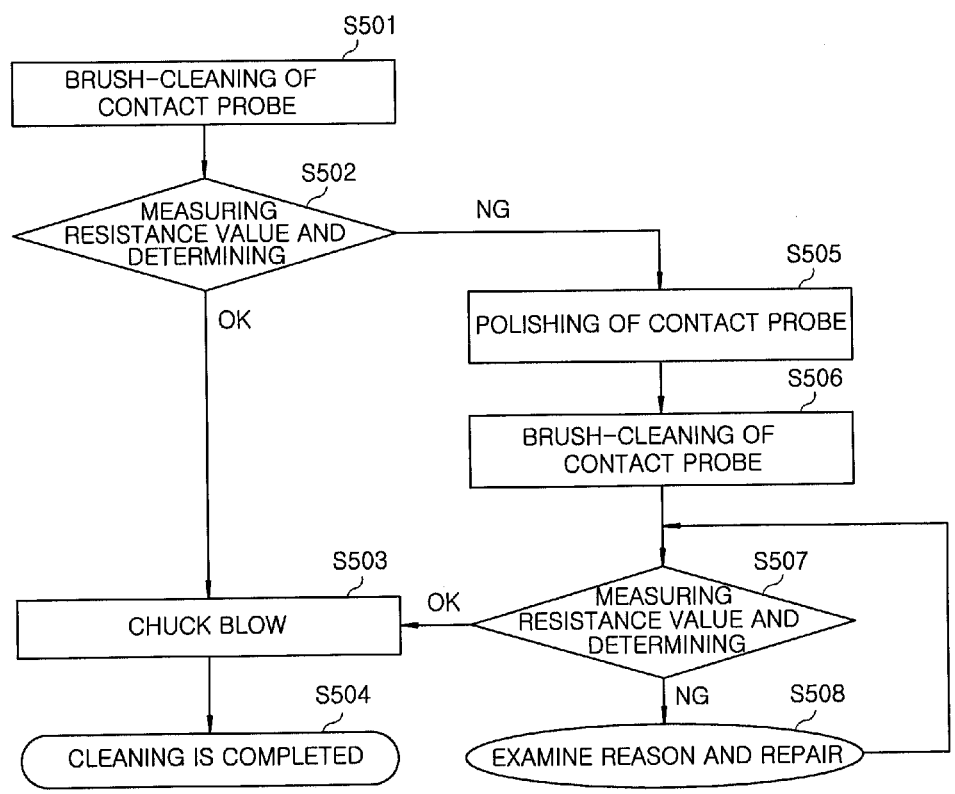
FIG. 7 is a flowchart of a cleaning method of the contact probe performed by the probe device of FIG. 1.

Next, a cleaning method of the contact probe 222 by the cleaning unit 410 having the above configuration will be described with reference to a flowchart of FIG. 7. The cleaning method to be described hereinafter is performed under a control of the control unit 600 shown in FIG. 1.

In the cleaning method of the contact probe 222 in accordance with the present embodiment, first, the top surface of the contact portion 222a of the contact probe 222 is made contact with the brush 411a and rubbed with the brush 411a by moving the mounting table 111. By doing so, a brush-cleaning is performed in step S501.

Thereafter, the top surface of the contact portion 222a of the contact probe 222 is made contact with the contact resistance measuring electrode 413a by moving the mounting table 111 and the contact resistance of the contact portion 222a is measured by the measuring mechanism (not shown). It is determined if the measured contact resistance value is equal to or smaller than a predetermined value in step S502. In this case, the predetermined value that is a determination criterion of the contact resistance value may be, e.g., about 1 mΩ to 10 mΩ, and specifically, e.g., 5 mΩ.

As a determination result of step S502, when the contact resistance value of the contact probe 222 is equal to or smaller than the predetermined value (OK in step S502), a gas is injected to the mounting surface of the mounting table 111 by a gas injection mechanism (not shown) installed at the bridge 400 to thereby perform a chuck blow for removing dust and the like from the mounting surface in step S503. Then, the cleaning is completed in step S504.

On the other hand, as a determination result of step S502, when the contact resistance value of the contact probe 222 is larger than the predetermined value (NG in step S502), the top surface of the contact portion 222a of the contact probe 222 is made contact with the polishing member 412a and rubbed with the polishing member 412a by moving the mounting table 111. By doing so, the top surface of the contact portion 222a is polished in step S505.

Subsequently, after completing the polishing of the top surface of the contact portion 222a by the polishing member 412a, the brush-cleaning of the contact portion 222a of the contact probe 222 is again performed by the brush 411a in step S506.

Thereafter, the top surface of the contact portion 222a of the contact probe 222 is again made contact with the contact resistance measuring electrode 413a and the contact resistance of the contact portion 222a is measured by the measuring mechanism (not shown). Then, it is determined if the measured contact resistance value is equal to or smaller than the predetermined value in step S507.

As a determination result of step S507, when the contact resistance value of the contact probe 222 is equal to or smaller than the predetermined value (OK in step S507), a gas is injected to the mounting surface of the mounting table 111 by the gas injection mechanism (not shown) installed at the bridge 400 to thereby perform a chuck blow for removing dust and the like from the mounting surface in step S503. Then, the cleaning is completed in step S504.

On the other hand, as a determination result of the step S507, when the contact resistance value of the contact probe 222 is larger than the predetermined value (NG in step S507), the reason that the contact resistance value of the contact probe 222 is large is examined to repair the contact probe 222 in step S508 and then the step is returned to step S507.

As described above, in the present embodiment, the cleaning of the contact probe 222 is performed by the cleaning unit 410. Accordingly, the contact resistance value of the contact probe 222 is always maintained at a low value equal to or smaller than the predetermined value for a long period of time, and thus a test can be performed with high precision for a long period of time.

Figure 8:
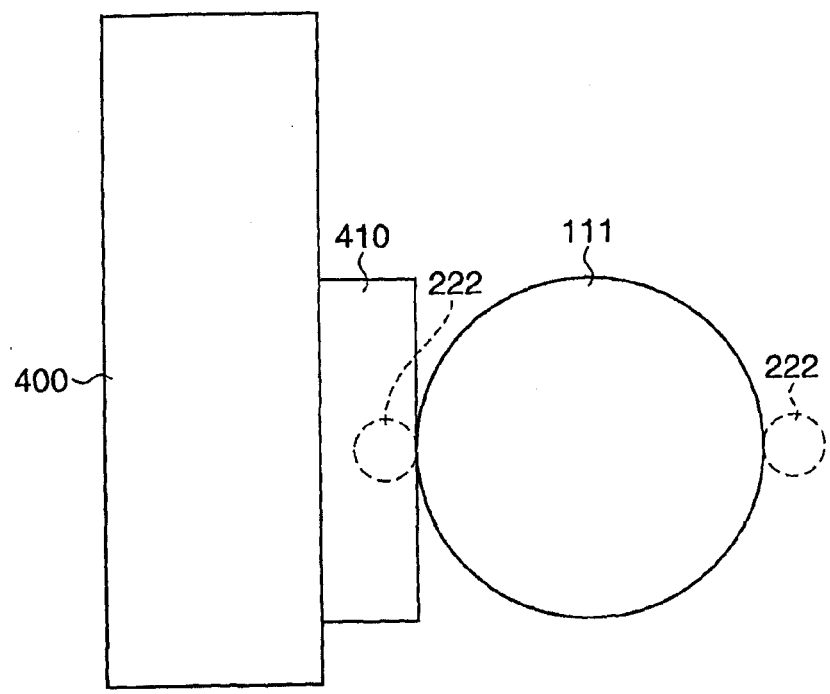
FIG. 8 is a plan view for explaining a cleaning operation of two contact probes by the cleaning unit shown in FIG. 1.
Figure 9:
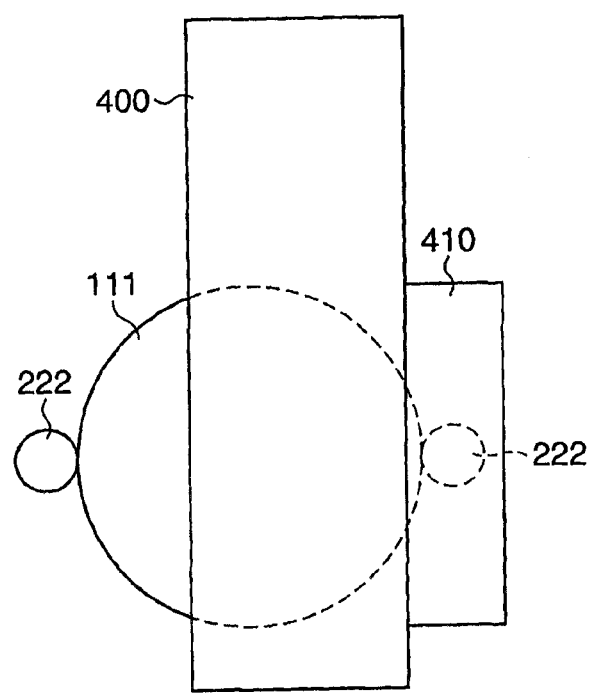
FIG. 9 is a plan view for explaining a cleaning operation of two contact probes by the cleaning unit shown in FIG. 1.

In the probe device 100 of the present embodiment, since two contact probes 222 are provided, as shown in FIGS. 8 and 9, the bridge 400 is first moved to place the cleaning unit 410 above one contact probe 222, and after a cleaning of the one contact probe 222 is completed, the bridge 400 is further moved to place the cleaning unit 410 above the other contact probe 222. Then, a cleaning of the other contact probe 222 is performed.

Next, a test sequence of the semiconductor wafer W by the probe device 100 will be described.

First, if the wafer carrier 151 accommodating the semiconductor wafers W is mounted on the load port 152 of the loader unit 150, the wafer carrier 151 is moved up and down by the vertical moving mechanism, and a slot accommodating the semiconductor wafer W is detected by the optical detector.

Next, the semiconductor wafer W is sucked and held by the wafer transfer arm 161 of the wafer transfer mechanism 160 and transferred to the position alignment mechanism 170. A position of the semiconductor wafer W is detected by detecting a notch of the semiconductor wafer W by the position alignment mechanism 170.

Next, the semiconductor wafer W of which the position has been detected by the position alignment mechanism 170 is taken from the position alignment mechanism 170 and mounted on the mounting table 111 of the measuring unit 110 by the wafer transfer arm 161 of the wafer transfer mechanism 160.

Then, the probes 211 are made contact with the semiconductor device of the semiconductor wafer W on the mounting table 111 to obtain electrical conduction between the tester 300 and the electrodes of the top surface of the semiconductor wafer W. Further, the contact portion 222a of the contact probe 222 is made contact with the electrode plate 221 to obtain electrical conduction between the tester 300 and the backside electrode of the semiconductor wafer W. In this state, a test signal is applied from the tester 300 to the semiconductor device, and an output signal from the semiconductor device is measured. By doing so, an electrical characteristic test of the semiconductor device is performed.

When the electrical characteristic test of the semiconductor device of the semiconductor wafer W is completed, the semiconductor wafer W is taken and accommodated in the wafer carrier 151 by the wafer transfer arm 161 of the wafer transfer mechanism 160. Then, the test of the semiconductor wafer W is completed.

As above, the present invention has been described with respect to the above embodiment, but the present invention is not limited to the above embodiment. For example, the contact probe is not limited to the shape shown in FIG. 3 and may use a plurality of pogo pins or may have various shapes.

The present application claims priority based on Japanese Patent Application No. 2013-067810 filed on Mar. 28, 2013, the entire contents of which are incorporated herein by reference.

DESCRIPTION OF REFERENCE NUMERALS

W semiconductor wafer
100 probe device
111 mounting table
112 driving mechanism
210 probe card
211 probe
220 conductive film electrode
221 electrode plate
222 contact probe
300 tester
410 cleaning unit
412 polishing unit
411 brush unit
413 contact resistance measuring unit

What is claimed is:

1. A probe device which is electrically connected to a semiconductor device formed on a semiconductor wafer and performs an electrical test of the semiconductor device by a tester, the probe device comprising:
    a mounting table configured to mount thereon the semiconductor wafer;
    a mounting table electrode formed on a mounting surface of the mounting table on which the semiconductor wafer is mounted, the mounting table electrode being in contact with a backside electrode formed on a backside of the semiconductor device;
    a probe card arranged above the mounting table, the prove card having a plurality of probes electrically connected to the tester;
    a driving mechanism configured to drive the mounting table to make the probes contact with electrodes of the semiconductor device of the semiconductor wafer mounted on the mounting table;
    an electrode plate arranged above the mounting table and electrically connected to the tester;
    a connection conductor arranged at a side of the mounting table and electrically connected to the mounting table electrode, the connection conductor being connectable to the electrode plate, wherein when the connection conductor is connected to the electrode plate, the backside electrode and the tester are electrically connected to each other; and
    a cleaning mechanism including a polishing unit configured to polish a contact portion of the connection conductor with the electrode plate, a brush cleaning unit configured to perform a brush-cleaning of the contact portion, and a contact resistance measuring unit configured to measure a contact resistance of the contact portion.

2. The probe device of claim 1, wherein the cleaning mechanism performs the brush-cleaning of the contact portion by the brush cleaning unit, measures the contact resistance of the contact portion by the contact resistance measuring unit, and when a measured value of the contact resistance is equal to or larger than a set value, polishes the contact portion by the polishing unit.

3. The probe device of claim 1, wherein the connection conductor is arranged in plural number at an interval along a circumferential direction of the mounting table.

4. The probe device of claim 1, wherein the cleaning mechanism is arranged above the mounting table and moved in parallel to the mounting surface.

\* \* \* \* \*